(12) United States Patent
Tsuji et al.

(10) Patent No.: US 8,941,103 B2
(45) Date of Patent: Jan. 27, 2015

(54) ORGANIC ELECTROLUMINESCENT ELEMENT

(75) Inventors: Hiroya Tsuji, Kyoto (JP); Varutt Kittichungchit, Osaka (JP); Nobuhiro Ide, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/006,442

(22) PCT Filed: Mar. 12, 2012

(86) PCT No.: PCT/JP2012/056226
§ 371 (c)(1),
(2), (4) Date: Sep. 20, 2013

(87) PCT Pub. No.: WO2012/128089
PCT Pub. Date: Sep. 27, 2012

(65) Prior Publication Data
US 2014/0008631 A1 Jan. 9, 2014

(30) Foreign Application Priority Data
Mar. 24, 2011 (JP) ................................ 2011-066568

(51) Int. Cl.
*H01L 29/08* (2006.01)
*H01L 35/24* (2006.01)
(Continued)

(52) U.S. Cl.
CPC ........ *H01L 51/5203* (2013.01); *H01L 51/5044* (2013.01); *H01L 2251/5361* (2013.01); *H01L 2251/558* (2013.01)
USPC ................ 257/40; 257/89; 438/28; 438/35; 438/99

(58) Field of Classification Search
CPC .................. H01L 27/3209; H01L 51/5044
USPC .................. 257/40, 79, 88, 89, 102, E51.022; 438/22, 28, 34, 35, 99
See application file for complete search history.

(56) References Cited

U.S. PATENT DOCUMENTS

| 7,329,984 B2 | 2/2008 | Nagara et al. |
| 7,525,129 B2 | 4/2009 | Masuda et al. |

(Continued)

FOREIGN PATENT DOCUMENTS

| JP | 2005-267990 | 9/2005 |
| JP | 2006-172762 | 6/2006 |
| JP | 2006-172763 | 6/2006 |

OTHER PUBLICATIONS

International Search Report (ISR) and Written Opinion (WO) in International Patent Application No. PCT/JP2012/056226, dated Jun. 12, 2012.

(Continued)

*Primary Examiner* — Colleen A Matthews
*Assistant Examiner* — Quovaunda V Jefferson
(74) *Attorney, Agent, or Firm* — Greenblum & Bernstein, P.L.C.

(57) ABSTRACT

The present invention proposes a white organic electroluminescent element which is a multiunit element capable of emitting high intensity light that is important to a light source for lighting use, and can have an extended lifetime while suppressing deterioration in luminance. The organic electroluminescent element includes: a transparent electrode; and a first light-emitting unit including a blue fluorescent light-emitting layer containing a blue fluorescent light-emitting material; an intermediate layer; and a second light-emitting unit including a red phosphorescent light-emitting layer containing a red phosphorescent light-emitting material and a green phosphorescent light-emitting layer containing a green phosphorescent light-emitting material; and a reflecting electrode, wherein: the first and second light-emitting units are stacked having the intermediate layer interposed therebetween; and a film thickness (tR) of the red phosphorescent light-emitting layer and a film thickness (tG) of the green phosphorescent light-emitting layer satisfy a relation of $5*tR \leq tG$.

16 Claims, 2 Drawing Sheets

(51) Int. Cl.
*H01L 51/00* (2006.01)
*H01L 51/52* (2006.01)
*H01L 51/50* (2006.01)

(56) References Cited

U.S. PATENT DOCUMENTS

| | | |
|---|---|---|
| 8,421,065 B2 | 4/2013 | Okumoto et al. |
| 2005/0206305 A1 | 9/2005 | Masuda et al. |
| 2006/0125380 A1 | 6/2006 | Nagara et al. |
| 2006/0158104 A1 | 7/2006 | Iijima et al. |
| 2008/0278066 A1* | 11/2008 | Spindler et al. ............... 313/504 |
| 2010/0078631 A1 | 4/2010 | Pieh |

OTHER PUBLICATIONS

D'Andrade et al., "Controlling Exciton Diffusion in Multilayer White Phosphorescent Organic Light emitting Devices", Advanced Materials, 14, No. 2, pp. 147-151 (Jan. 16, 2002).

Office Action from Japan Patent Office (JPO) in Japanese Patent Application No. 2012-273812, dated Apr. 30, 2014.

* cited by examiner

ORGANIC ELECTROLUMINESCENT ELEMENT

TECHNICAL FIELD

The present invention relates to an organic electroluminescent element.

BACKGROUND ART

Organic electroluminescent elements have attracted attention as a next-generation illumination light source because they enable planar light-emission and enable light emission of any color tone depending on the selection of light-emitting substances, and have been vigorously developed with the aim of practical use. In particular, research and development has been actively conducted especially with regard to technologies for extending the lifetime, methods for extending the lifetime by various design and technological developments of devices have been proposed. However, problems remain in order to realize sufficient improvement in a lifetime property in comparison with conventional main lighting, that is, fluorescent lamps.

JP 2006-172763A (Patent Literature 1) discloses a method for improving all of whiteness, luminance efficacy, and a lifetime. In this method, a non-luminescent interfacial layer is interposed between a light-emitting layer containing a fluorescent dopant and a light-emitting layer containing a phosphorescent dopant, and a fluorescent light-emitting layer is positioned closer to a cathode than a phosphorescent light-emitting layer is, and a red phosphorescent light-emitting layer is formed into a thin film having an island shape. However, Patent Literature 1 does not describe change in chromaticity and does not disclose clearly technologies for improving the lifetime of a multiunit element in which change in chromaticity tends to increase with the passage of time.

CITATION LIST

Patent Literature

Patent Literature 1: JP 2006-172763 A

SUMMARY OF INVENTION

Technical Problem

In view of the above insufficiency, the present invention has aimed to propose a white organic electroluminescent element which is a multiunit element capable of emitting high intensity light that is important to a light source for lighting use, and can have an extended lifetime while suppressing deterioration in luminance.

Solution to Problem

An organic electroluminescent element in accordance with the present invention includes: a transparent electrode; and a first light-emitting unit including a blue fluorescent light-emitting layer containing a blue fluorescent light-emitting material; and an intermediate layer; and a second light-emitting unit including a red phosphorescent light-emitting layer containing a red phosphorescent light-emitting material and a green phosphorescent light-emitting layer containing a green phosphorescent light-emitting material; and a reflecting electrode, wherein: the first light-emitting unit and the second light-emitting unit are stacked such that the intermediate layer is interposed between the first light-emitting unit and the second light-emitting unit; and a film thickness (tR) of the red phosphorescent light-emitting layer and a film thickness (tG) of the green phosphorescent light-emitting layer satisfy a relation of $5*tR \leq tG$.

In the organic electroluminescent element, it is preferable that the film thickness (tR) of the red phosphorescent light-emitting layer is 5 nm or less.

In the organic electroluminescent element, it is preferable that each of the red phosphorescent light-emitting layer and the green phosphorescent light-emitting layer contains an electron transporting material as a host material and the red phosphorescent light-emitting layer is disposed close to the transparent electrode, and the green phosphorescent light-emitting layer is disposed close to the reflecting electrode.

In the organic electroluminescent element, it is preferable that each of the red phosphorescent light-emitting layer and the green phosphorescent light-emitting layer contains a hole transport material as a host material and the red phosphorescent light-emitting layer is disposed close to the reflecting electrode, and the green phosphorescent light-emitting layer is disposed close to the transparent electrode.

In the organic electroluminescent element, it is preferable that the first light-emitting unit is disposed close to the transparent electrode, and the second light-emitting unit is disposed close to the reflecting electrode.

Advantageous Effects of Invention

According to the present invention, it is possible to obtain a white organic electroluminescent element with long-life in which deterioration in luminance is suppressed, which is a multiunit element capable of emitting high luminance that is important to an illumination light source.

DESCRIPTION OF EMBODIMENTS

Hereinafter, embodiments of the present invention will be described.

Figure 1:
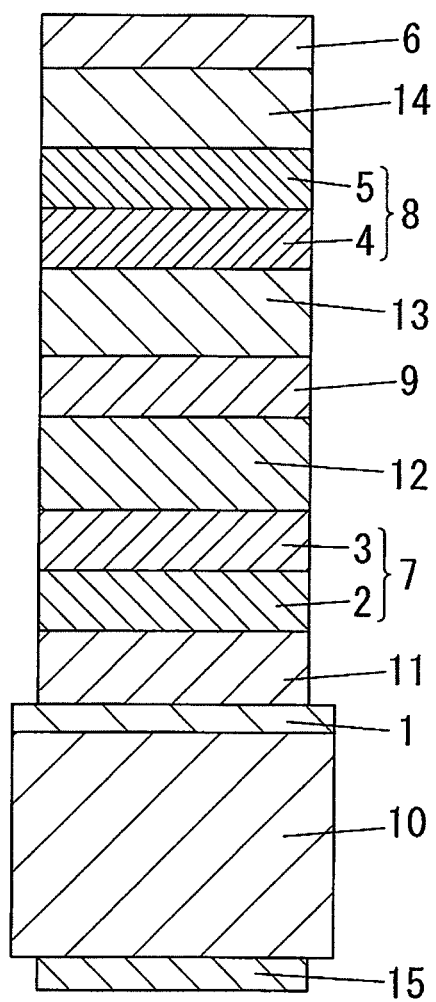
FIG. 1 is a sectional view showing an overview of a layer structure of an organic electroluminescent element.

An example of the structure of an organic electroluminescent element according to the present invention is shown in FIG. 1. This organic electroluminescent element is formed by forming a transparent electrode 1 on the surface of a substrate 10, and providing a first hole transporting layer 11, a blue fluorescent light-emitting layer 2, a green fluorescent light-emitting layer 3, a first electron transporting layer 12, an intermediate layer 9, a second hole transporting layer 13, a red phosphorescent light-emitting layer 4, a green phosphorescent light-emitting layer 5, a second electron transporting layer 14 and a reflecting electrode 6 on the transparent electrode 1 in this order. A light extracting layer 15 is further formed on the opposite surface of the substrate 10 to the transparent electrode 1. Hereinafter, embodiments will be described using this structure as an example, but this structure is merely an example, and the present invention is not limited to this structure within the intent of the present invention.

It is preferable that the substrate 10 has optical transparency. The substrate 10 may be colorless and transparent or slightly colored. The substrate 10 may have a frosted glass appearance. Examples of materials for the substrate 10 include transparent glass such as soda-lime glass and alkali-free glass, and plastic such as polyester resin, polyolefin resin, polyamide resin, epoxy resin, and fluorine-based resin. The shape of the substrate 10 may be a film-like shape or a plate-like shape.

The transparent electrode 1 functions as an anode. An anode in the organic electroluminescent element is an electrode for injecting holes into a light-emitting layer. A metallic oxide such as ITO (indium-tin oxide), $SnO_2$, ZnO and IZO (indium-zinc oxide), or the like is used as a material for forming the transparent electrode 1. The transparent electrode 1 may be formed using these materials by an appropriate method such as a vacuum vapor deposition method, a sputtering method, and application. A preferable thickness of the transparent electrode 1 varies depending on the materials constituting the transparent electrode 1, but the thickness may be set to 500 nm or less, and preferably in a range from 10 nm to 200 nm.

The material constituting the first hole transporting layer 11 and the second hole transporting layer 13 (hole transporting material) is appropriately selected from a group of compounds having a hole transporting property, and it is preferable that it is a compound that has a property of donating electrons and is stable when undergoing radical cationization due to electron donation. Examples of the hole transporting materials include: triarylamine-based compounds, amine compounds containing a carbazole group, amine compounds containing fluorene derivatives, and starburst amines (m-MTDATA), representative examples of which include polyaniline, 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4"-tris(N-(3-methylphenyl)N-phenylamino)triphenylamine (MTDATA), spiro-NPD, Spiro-TPD, Spiro-TAD, and TNB; and 1-TMATA, 2-TNATA, p-PMTDATA, TFATA or the like as a TDATA-based material, but examples thereof are not limited to these, and any hole transporting material that is generally known is used. The first hole transporting layer 11 and the second hole transporting layer 13 can be formed by an appropriate method such as a vapor deposition method.

It is preferable that the material for forming the first electron transporting layer 12 and the second electron transporting layer 14 (electron transporting material) is a compound that has the ability to transport electrons, can accept electrons injected from the reflecting electrode 6, and exhibits excellent electron injection effects on the light-emitting layers, and moreover, prevents the movement of holes to the first electron transporting layer 12 and the second electron transporting layer 14 and is excellent in terms of thin film formability. Examples of the electron transporting materials include Alq3, oxadiazole derivatives, starburst oxadiazole, triazole derivatives, phenylquinoxaline derivatives, and silole derivatives. Specific examples of the electron transporting materials include fluorene, bathophenanthroline, bathocuproine, anthraquinodimethane, diphenoquinone, oxazole, oxadiazole, triazole, imidazole, etc., and compounds thereof, metal-complex compounds, and nitrogen-containing five-membered ring derivatives. Specifically, examples of metal-complex compounds include tris(8-hydroxyquinolinato) aluminum, tri(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato) zinc, bis(2-methyl-8-quinolinato)(o-cresolate)gallium, bis (2-methyl-8-quinolinato)(1-naphtholate)aluminum, and bis (2-methy-8-quinolinato)-4-phenylphenolato, but are not limited thereto. Preferable examples of nitrogen-containing five-membered ring derivatives include oxazole, thiazole, oxadiazole, thiadiazole, and triazole derivatives, and specific examples thereof include 2,5-bis(1-phenyl)-1,3,4-oxazole, 2,5-bis(1-phenyl)-1,3,4-thiazole, 2,5-bis(1-phenyl)-1,3,4-oxadiazole, 2-(4'-tert-butylphenyl)-5-(4"-biphenyl)1,3,4-oxadiazole, 2,5-bis(1-naphthyl)-1,3,4-oxadiazole, 1,4-bis[2-(5-phenylthiadiazolyl)]benzene, 2,5-bis(1-naphthyl)-1,3,4-triazole, and 3-(4-biphenylyl)-4-phenyl-5-(4-t-butylphenyl)-1,2,4-triazole, but are not limited thereto. Examples of the electron transporting materials include the polymer materials used for a polymer organic electroluminescent element. Examples of these polymer materials include polyparaphenylene and derivatives thereof, and fluorene and derivatives thereof. There is no particular limitation on the thickness of the first electron transporting layer 12 and the second electron transporting layer 14, and for example, it is formed to have a thickness in the range of 10 nm to 300 nm. The first electron transporting layer 12 and the second electron transporting layer 14 can be formed by an appropriate method such as a vapor deposition method.

The reflecting electrode 6 functions as a cathode. A cathode in the organic electroluminescent element is an electrode for injecting electrons into a light-emitting layer. It is preferable that the reflecting electrode 6 is formed of a material having a small work function, such as a metal, an alloy, an electric conductive compound, and a mixture of these. Examples of materials for forming the reflecting electrode 6 include Al, Ag, and MgAg. The reflecting electrode 6 may be formed of an $Al/Al_2O_3$ mixture, and suchlike. The reflecting electrode 6 may be formed using these materials by an appropriate method such as a vacuum vapor deposition method and a sputtering method. A preferable thickness of the reflecting electrode 6 varies depending on the materials constituting the reflecting electrode 6, but the thickness may be set to 500 nm or less, and preferably in the range from 20 nm to 200 nm.

The light extracting layer 15 can be formed by stacking light-scattering films or microlens films on the surface of the substrate 10 on the opposite side to the transparent electrode 1 to improve a light diffusion property.

Each light-emitting layer (the blue fluorescent light-emitting layer 2, the green fluorescent light-emitting layer 3, the red phosphorescent light-emitting layer 4 and the green phosphorescent light-emitting layer 5) may be formed of an organic material (host material) doped with a light-emitting material (dopant).

Any of an electron transporting material, a hole transporting material, and a material having both of electron transporting property and hole transporting property may be used as the host material. An electron transporting material and a hole transporting material may be used in combination as the host material.

The blue fluorescent light-emitting material contained in the blue fluorescent light-emitting layer 2 is not particularly limited and any fluorescent light-emitting material can be used.

Examples of host materials constituting the blue fluorescent light-emitting layer 2 include TBADN (2-t-butyl-9,10-di(2-naphthyl)anthracene), AND, and BDAF. It is preferable that the concentration of the blue fluorescent light-emitting material is in the range from 1% by mass to 30% by mass.

The green fluorescent light-emitting material contained in the green fluorescent light-emitting layer 3 is not particularly limited and any fluorescent light-emitting material can be used.

Examples of host materials constituting the green fluorescent light-emitting layer 3 include Alq3 (tris-(8-oxoquinoline)aluminium (III)), AND, and BDAF. It is preferable that the concentration of the green fluorescent light-emitting material is in the range from 1% by mass to 20% by mass.

The green phosphorescent light-emitting material contained in the green phosphorescent light-emitting layer 5 is not particularly limited and any phosphorescent light-emitting material can be used.

Examples of host materials constituting the green phosphorescent light-emitting layer 5 include CBP (4,4'-N,N'-dicarbazole-biphenyl), CzTT, TCTA, mCP, and CDBP. CBZ, CzTT, mCP, CDBP out of these compounds are materials having both of electron transporting property and hole transporting property. TCTA is a hole transporting material and TAZ is an electron transporting material. It is preferable that the concentration of the green phosphorescent light-emitting material is in the range from 1% by mass to 40% by mass.

The red phosphorescent light-emitting material contained in the red phosphorescent light-emitting layer 4 is not particularly limited and any phosphorescent light-emitting material can be used.

Examples of host materials for the red phosphorescent light-emitting layer 4 are similar to host materials for the green phosphorescent light-emitting material. It is preferable that the concentration of the red phosphorescent light-emitting material is in the range from 1% by mass to 40% by mass.

Each light-emitting layer (the blue fluorescent light-emitting layer 2, the green fluorescent light-emitting layer 3, the red phosphorescent light-emitting layer 4, and the green phosphorescent light-emitting layer 5) may be formed by appropriate methods including a dry process (e.g., a vacuum vapor deposition and transfer) and a wet process (e.g., spin coating, spray coating, die coating, and gravure printing).

In the organic electroluminescent element according to the present invention, the first light-emitting unit 7 and a second light-emitting unit 8 are stacked such that an intermediate layer 9 is interposed between them, so that a multiunit structure is formed as shown in FIG. 1. The first light-emitting unit 7 includes at least the blue fluorescent light-emitting layer 2 and may include the blue fluorescent light-emitting layer 2 and the green fluorescent light-emitting layer 3 which are stacked as shown in FIG. 1. The second light-emitting unit 8 includes the green phosphorescent light-emitting layer 5 and the green phosphorescent light-emitting layer 4 which are stacked.

The intermediate layer 9 serves the function of electrically connecting two light-emitting units in series. It is preferable that the intermediate layer 9 has high transparency and is highly thermally and electrically stable. The intermediate layer 9 can be formed of a layer that forms an equipotential surface, a charge generation layer, or the like. Examples of the materials for a layer that forms an equipotential surface or a charge generation layer include: a thin film of metal such as Ag, Au, or Al; metal oxides such as vanadium oxide, molybdenum oxide, rhenium oxide, and tungsten oxide; a transparent conductive film such as ITO, IZO, AZO, GZO, ATO, and $SnO_2$; a so-called laminate of an n-type semiconductor and a p-type semiconductor; a laminate of a metal thin film or transparent conductive film, and either one of or both an n-type semiconductor and a p-type semiconductor; a mixture of an n-type semiconductor and a p-type semiconductor; and a mixture of a metal and either one of or both an n-type semiconductor and a p-type semiconductor. There is no particular limitation on the n-type semiconductor and the p-type semiconductor, and any semiconductors selected as necessary are used. The n-type semiconductor and the p-type semiconductor may be formed of either an inorganic material or an organic material. The n-type semiconductor and the p-type semiconductor may be a mixture of an organic material and a metal; a combination of an organic material and a metal oxide; or a combination of an organic material and an organic acceptor/donor material or inorganic acceptor/donor material. The intermediate layer 9 can be formed of BCP:Li, ITO, $NPD:MoO_3$, Liq:Al, or the like. BCP indicates 2,9-dimethyl-4,7-diphenyl-1,10-phenanthroline. For example, the intermediate layer 9 can have a two-layered configuration obtained by disposing a first layer made of BCP:Li close to the anode, and a second layer made of ITO close to the cathode side. It is preferable that the intermediate layer 9 has a layer structure such as $Alq3/Li_2O$/HAT-CN6, $Alq3/Li_2O$, or $Alq3/Li_2O$/Alq3/HAT-CN6.

A demand of the materials for improving the performance of the first light-emitting unit 7 and a demand of the materials for improving the performance of the second light-emitting unit 8 differ in the physical properties of the materials such as ionization potential, electron affinity and triplet energy level. Therefore, it is possible to select materials for each unit by disposing the intermediate layer 9 so that the first light-emitting unit 7 and the second light-emitting unit 8 are separated by the intermediate layer 9. This separation of the first light-emitting unit 7 and the second light-emitting unit 8 is effective in realizing high efficiency and long life. Furthermore, a multiunit structure in which the first light-emitting unit 7 having an emission spectrum in the region of a relatively short wavelength and the second light-emitting unit 8 having an emission spectrum in the region of a relatively long wavelength can be arranged separately owing the interposed intermediate layer 9 makes optical design facilitated. The facilitated optical design can realize high efficiency, long life, high luminance, a reduced viewing angle dependency of chromaticity and the like as well as improved color rendering properties.

The organic electroluminescent element in accordance with the present invention, a film thickness (tR) of the red phosphorescent light-emitting layer 4 and a film thickness (tG) of the green phosphorescent light-emitting layer 5 satisfy a relation of $5*tR \leq tG$. In this manner, the red phosphorescent light-emitting layer 4 is formed to have the film thickness (tR) extremely smaller than the film thickness (tG) of the green phosphorescent light-emitting layer 5. Hence, along with the passage of time in which the second light emitting unit 8 is driven, a proportion of the emission intensity of the red phosphorescence to the emission intensity of the green phosphorescence with regard to light emitted from the second light emitting unit 8 is changed in such a manner that the emission intensity of the green phosphorescence greater in the luminosity function than the emission intensity of the red phosphorescence is increased relative to the emission intensity of the red phosphorescence. Therefore, the lifetime regarding luminance life is improved.

Figure 2:
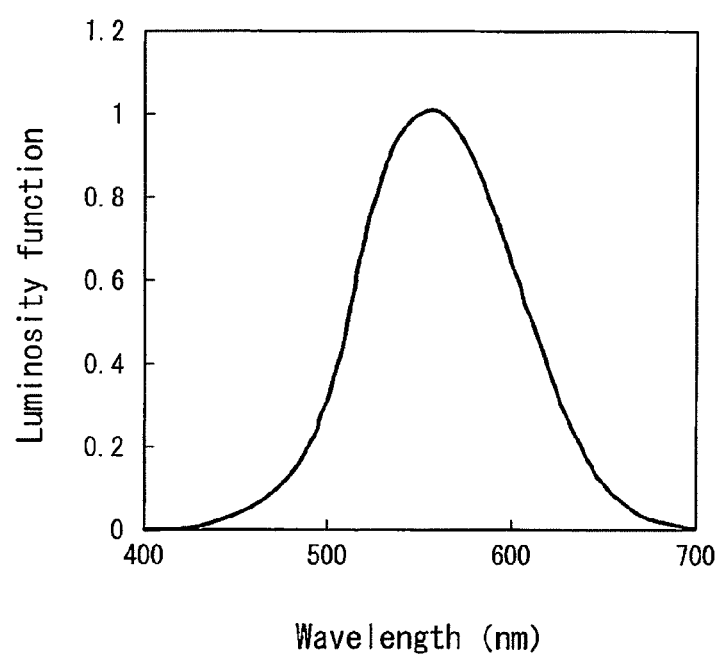
FIG. 2 is a chart illustrating a luminosity function curve indicative of a relation between a wavelength and a luminosity function.

The lifetime property of the organic electroluminescent element generally refers to the luminance lifetime property. Luminance is defined as a product of a radiant intensity and the luminosity function. Therefore, if the radiant intensity is constant, luminance is high when an emission spectrum is present in a range of high luminosity functions. In the present invention, an emission spectrum is designed to have an intensity which is increased, in a region of the high luminosity function, along with the passage of time in which the element is driven. Therefore, it is possible to extend the lifetime by suppressing deterioration in luminance rather than suppressing deterioration in the radiant intensity. FIG. 2 shows the luminosity function curve. As is obvious, the luminosity function curve has a peak at 555 nm, and luminous functions are relatively high in the green light-emitting region. In view of this property, the element is designed such that the emission intensity of the green phosphorescence exceeds the emission intensity of the red phosphorescence after the element is driven. According to this, it is possible to suppress a decrease in luminance and extend the lifetime.

Basically, a phenomenon that an emission spectrum is changed along with the passage of time in which the element is driven is undesirable. However, change in color within a desired white region is acceptable for lighting applications. Therefore, in the present invention, to achieve the extension of the lifetime, the emission spectrum is purposely changed in the white region permissible.

Generally, a slight change in an emission zone (recombination zone) is caused by a continuous drive of the organic electroluminescent element. In the present invention, the red phosphorescent light-emitting layer 4 is thinned. Therefore, it is possible to effectively change an emission color into an intended color, even when the emission zone slightly is changed due to the continuous drive of the element.

Concretely, it is sufficient that the film thickness (tR) of the red phosphorescent light-emitting layer 4 and the film thickness (tG) of the green phosphorescent light-emitting layer 5 satisfy the relation of $5*tR \leq tG$. The film thickness (tR) of the red phosphorescent light-emitting layer 4 is not limited as long as it satisfies the aforementioned relation, but is preferably 5 nm or less and is more preferably 3 nm or less (lower limit of about 0.1 nm). Change in the emission color along with the passage of time in which the element is driven is effectively controlled by reducing the film thickness (tR) of the red phosphorescent light-emitting layer 4. By adjusting the emission intensity of the green phosphorescence with the relatively high luminosity function to be greater than the emission intensity of the red phosphorescence, deterioration in luminance can be suppressed.

The film thickness (tG) of the green phosphorescent light-emitting layer 5 is not limited as long as the it is five or more times as large as the film thickness (tR) of the red phosphorescent light-emitting layer 4, but is preferably ten or more times as large as the tR (upper limit of about 80 times as large as the tR). As the rate of the thicknesses of the light-emitting layers is increased, an effective change in the emission color can be more easily achieved. Furthermore, when the second light-emitting unit 8 is thinned, the numbers of electrons and holes which pass through the second light-emitting unit 8 are likely to be increased. This causes a decrease in the efficiency and the lifetime. To prevent such disadvantages, the film thickness of the second light-emitting unit 8 is preferably 20 nm or more (upper limit of about 80 nm).

Furthermore, an order of stacking the red phosphorescent light-emitting layer 4 and the green phosphorescent light-emitting layer 5 is not limited, but it is preferable that the red phosphorescent light-emitting layer 4 is disposed close to the transparent electrode 1 (anode) and the green phosphorescent light-emitting layer 5 is disposed close to the reflecting electrode 6 (cathode) when each of the red phosphorescent light-emitting layer 4 and the green phosphorescent light-emitting layer 5 includes the electron transporting material as the host material. When the electron transporting material is used as the host material, the second hole transporting layer 13 is deteriorated with the passage of time in which the element is driven, and hole injection to the second light-emitting unit 8 is suppressed, and the emission zone shifts away from the second hole transporting layer 13 and close to the second electron transporting layer 14. Therefore, it is possible to adjust the emission color. Moreover, by disposing the red phosphorescent light-emitting layer 4 close to the transparent electrode 1 and disposing the green phosphorescent light-emitting layer 5 close to the reflecting electrode 6, the emission zone can be concentrated close to the red phosphorescent light-emitting layer 4. Furthermore, since the above deterioration along with the passage of time in which the element is driven causes the emission zone to exist close to the reflecting electrode 6, deterioration in luminance can be suppressed sufficiently.

On the other hand, when each of the red phosphorescent light-emitting layer 4 and the green phosphorescent light-emitting layer 5 includes the hole transporting material as the host material, it is preferable that the red phosphorescent light-emitting layer 4 is disposed close to the reflecting electrode 6 (cathode) and the green phosphorescent light-emitting layer 5 is disposed close to the transparent electrode 1 (anode). When a hole transporting material is used as the host material, the second electron transporting layer 14 is deteriorated along with the passage of time in which the element is driven, electron injection to the second light-emitting unit 8 is suppressed, and the emission zone shifts away from the second electron transporting layer 14 and close to the second hole transporting layer 13. Therefore, it is possible to adjust the emission color. Moreover, by disposing the red phosphorescent light-emitting layer 4 close to the reflecting electrode 6 and disposing the green phosphorescent light-emitting layer 5 close to the transparent electrode 1, the emission zone can be present close to the red phosphorescent light-emitting layer 4. Furthermore, since the above deterioration along with the passage of time in which the element is driven causes the emission zone to exist close to the transparent electrode 1, deterioration in luminance can be suppressed sufficiently.

Furthermore, in view of improving efficiency and suppressing the viewing angle dependency of chromaticity, it is preferable that the first light-emitting unit 7 is disposed close to the transparent electrode 1 and the second light-emitting unit 8 is disposed close to the reflecting electrode 6 as shown in FIG. 1. Loss due to interference is less for a light-emitting unit disposed close to the reflecting electrode 6 than for a light-emitting unit disposed close to the transparent electrode 1, and the light extraction efficiency of the light-emitting unit disposed close to the reflecting electrode 6 tends to be higher than the light extraction efficiency of the light-emitting unit disposed close to the transparent electrode 1. Therefore, it is possible to suppress deterioration in luminance and improve efficiency by disposing the second light-emitting unit 8 with a high internal quantum efficiency close to the reflecting electrode 6 where the light extraction efficiency is relatively high.

As described above, in the second light-emitting unit 8 of the organic electroluminescent element in accordance with the present invention, the red phosphorescent light-emitting layer 4 is extremely thinned to have the film thickness (tR) that is one fifth or less of the film thickness (tG) of the green phosphorescent light-emitting layer 5. Therefore, it is possible to control change in an emission spectrum along with the passage of time in which the element is driven such that the emission intensity of the green phosphorescence exceeds the emission intensity of the red phosphorescence. By adjusting the emission intensity of the green phosphorescence related to the higher luminosity function to be greater than the emission intensity of the red phosphorescence, the deterioration in the luminance can be suppressed and the luminance lifetime can be extended.

EXAMPLES

Hereinafter, the present invention will be specifically described by way of examples.

Example 1

An organic electroluminescent element as shown in FIG. 1 was prepared. Specifically, a transparent electrode 1 was formed by depositing ITO with a thickness of 130 nm on a substrate 10 (a glass substrate). A first hole transporting layer 11, a blue fluorescent light-emitting layer 2 (containing BCzVBi as a blue fluorescent light-emitting material), a green fluorescent light-emitting layer 3 (containing TPA as a green fluorescent light-emitting material) and a first electron transporting layer 4 were further formed by a vapor deposition method with a thickness between 5 nm and 60 nm on the transparent electrode 1 in this order. Next, an intermediate layer 9 having a layer structure of Alq3/Li$_2$O/Alq3/HAT-CN6 was stacked with a layer thickness of 15 nm. Then, a second hole transporting layer 13, a red phosphorescent light-emitting layer 4 (TAZ as a host material doped with Ir(piq)$_3$ which is a red phosphorescent light-emitting material), a green phosphorescent light-emitting layer 5 (TAZ as a host material doped with Bt$_2$Ir(acac) which is a green phosphorescent light-emitting material) and a second electron transporting layer 14 were formed with a maximum film thickness of each layer of 50 nm in this order. Subsequently, a reflecting electrode 6 made of an Al film was sequentially formed. Note that light-scattering film was stacked on the opposite surface of the substrate 10 to the transparent electrode 1 to form the light extracting layer 15.

A first light-emitting unit 7 was formed to include the blue fluorescent light-emitting layer 2 and the green fluorescent light-emitting layer 3. A second light-emitting unit 8 was formed to include the red phosphorescent light-emitting layer 4 having the film thickness of 1.5 nm and the green phosphorescent light-emitting layer 5 having the film thickness of 38.5 nm. The film thickness (tG) of the green phosphorescent light-emitting layer 5 is 26 times as large as the thickness (tR) of the red phosphorescent layer 4.

With regard to the organic electroluminescent element obtained with the aforementioned manner, a result of a continuous drive with initial luminance of 3000 cd/m$^2$ shows the white light emission is still maintained at LT 70 and the emission intensity of the green phosphorescence is increased relative to the emission intensity of the red phosphorescence and the luminance lifetime is prolonged.

Example 2

An organic electroluminescent element was prepared in the same manner as in Example 1, except that the film thickness (tR) of the red phosphorescent light-emitting layer 4 was set to 5 nm and the film thickness of the green phosphorescent light-emitting layer 5 was set to 35 nm.

With regard to the organic electroluminescent element obtained with the aforementioned manner, a result of a continuous drive with initial luminance of 3000 cd/m$^2$ shows that the emission intensity of the green phosphorescence is increased relative to the emission intensity of the red phosphorescence and the luminance lifetime is prolonged.

Example 3

An organic electroluminescent element was prepared in the same manner as in Example 1, except that the film thickness (tR) of the red phosphorescent light-emitting layer 4 was set to 10 nm and the film thickness of the green phosphorescent light-emitting layer 5 was set to 70 nm.

With regard to the organic electroluminescent element obtained with the aforementioned manner, a result of a continuous drive with initial luminance of 3000 cd/m$^2$ shows that the emission intensity of the green phosphorescence is increased relative to the emission intensity of the red phosphorescence and the luminance lifetime is prolonged. Note that the drive voltage is increased with an increase in the film thickness (tG) of the green phosphorescent light-emitting layer 5.

Example 4

An organic electroluminescent element was prepared with the following method. Specifically, a transparent electrode 1 was formed by depositing ITO with a thickness of 130 nm on a substrate 10 (a glass substrate). A first hole transporting layer 11, a blue fluorescent light-emitting layer 2 (containing BCzVBi as a blue fluorescent light-emitting material), a green fluorescent light-emitting layer 3 (containing TPA as a green fluorescent light-emitting material) and a first electron transporting layer 4 were further formed by a vapor deposition method with a thickness between 5 nm and 60 nm on the transparent electrode 1 in this order. Next, an intermediate layer 9 having a layer structure of Alq3/Li$_2$O/Alq3/HAT-CN6 was stacked with a layer thickness of 15 nm. Then, a second hole transporting layer 13, a green phosphorescent light-emitting layer 5 (TAZ as a host material doped with Bt$_2$Ir(acac) which is a green phosphorescent light-emitting material), a red phosphorescent light-emitting layer 4 (TAZ as a host material doped with Ir(piq)$_3$ which is a red phosphorescent light-emitting material), and a second electron transporting layer 14 were formed with a maximum film thickness of each layer of 50 nm in this order. Subsequently, a reflecting electrode 6 made of an Al film was sequentially formed. Note that light-scattering film was stacked on the opposite surface of the substrate 10 to the transparent electrode 1 to form the light extracting layer 15.

A first light-emitting unit 7 was formed to include the blue fluorescent light-emitting layer 2 and the green fluorescent light-emitting layer 3. A second light-emitting unit 8 was formed to include the red phosphorescent light-emitting layer 4 having the film thickness of 1.5 nm and the green phosphorescent light-emitting layer 5 having the film thickness of 38.5 nm. The film thickness (tG) of the green phosphorescent light-emitting layer 5 is 26 times as large as the thickness (tR) of the red phosphorescent layer 4.

With regard to the organic electroluminescent element obtained with the aforementioned manner, a result of a continuous drive with initial luminance of 3000 cd/m$^2$ shows the white light emission is still maintained at LT 70 and the emission intensity of the green phosphorescence is increased relative to the emission intensity of the red phosphorescence and the luminance lifetime is prolonged.

Comparative Example 1

An organic electroluminescent element was prepared in the same manner as in Example 1, except that the film thickness (tR) of the red phosphorescent light-emitting layer 4 was set to 10 nm and the film thickness of the green phosphorescent light-emitting layer 5 was set to 30 nm.

With regard to the organic electroluminescent element obtained with the aforementioned manner, a result of a continuous drive with initial luminance of 3000 cd/m$^2$ shows that the emission intensity of the green phosphorescence is slightly lower than the emission intensity of the red phosphorescence and that the luminance lifetime is shorter than in those in Examples.

Comparative Example 2

An organic electroluminescent element was prepared in the same manner as in Example 1, except that the film thickness (tR) of the red phosphorescent light-emitting layer 4 was set to 5 nm and the film thickness of the green phosphorescent light-emitting layer 5 was set to 10 nm.

With regard to the organic electroluminescent element obtained with the aforementioned manner, a result of a continuous drive with initial luminance of 3000 cd/m² shows that the emission intensity of the green phosphorescence is slightly lower than the emission intensity of the red phosphorescence and that the luminance lifetime is shorter than those in Examples.

TABLE 1

| | Film thickness (tR) of red phosphorescent light-emitting layer:film thickness (tG) of green phosphorescent layer | Initial chromaticity | Chromaticity at LT 70 | Luminance life (LT70) (given, luminance life in Example 1 is 1) | Drive voltage when 10 mA/cm² is applied |
|---|---|---|---|---|---|
| Example 1 | 1.5 nm:38.5 nm | (0.345, 0.356) | (0.341, 0.364) | 1 | 9.5 V |
| Example 2 | 5 nm:35 nm | (0.347, 0.351) | (0.344, 0.357) | 0.95 | 9.6 V |
| Example 3 | 10 nm:70 nm | (0.356, 0.345) | (0.344, 0.358) | 0.90 | 12.5 V |
| Example 4 | 1.5 nm:38.5 nm | (0.344, 0.355) | (0.340, 0.365) | 1.01 | 9.7 V |
| Comparative Example 1 | 10 nm:30 nm | (0.358, 0.345) | (0.358, 0.341) | 0.7 | 9.7 V |
| Comparative Example 2 | 5 nm:10 nm | (0.349, 0.348) | (0.350, 0.346) | 0.73 | 8.6 V |

REFERENCE SIGNS LIST
1 Transparent electrode
2 Blue fluorescent light-emitting layer
4 Red phosphorescent light-emitting layer
5 Green phosphorescent light-emitting layer
6 Reflecting electrode
7 First light-emitting unit
8 Second light-emitting unit
9 Intermediate layer

The invention claimed is:

1. An organic electroluminescent element, comprising:
a transparent electrode;
a first light-emitting unit including a blue fluorescent light-emitting layer containing a blue fluorescent light-emitting material;
an intermediate layer;
a second light-emitting unit including a red phosphorescent light-emitting layer containing a red phosphorescent light-emitting material and a green phosphorescent light-emitting layer containing a green phosphorescent light-emitting material; and
a reflecting electrode,
wherein:
the first light-emitting unit and the second light-emitting unit are stacked such that the intermediate layer is interposed between the first light-emitting unit and the second light-emitting unit; and
a film thickness (tR) of the red phosphorescent light-emitting layer and a film thickness (tG) of the green phosphorescent light-emitting layer satisfy a relation of $7 \cdot tR \leq tG$.

2. The organic electroluminescent element according to claim 1, wherein
the film thickness (tR) of the red phosphorescent light-emitting layer is 5 nm or less.

3. The organic electroluminescent element according to claim 1, wherein:
each of the red phosphorescent light-emitting layer and the green phosphorescent light-emitting layer contains an electron transporting material as a host material;
the red phosphorescent light-emitting layer is disposed closer to the transparent electrode; than the green phosphorescent light-emitting layer; and
the green phosphorescent light-emitting layer is disposed closer to the reflecting electrode than the red phosphorescent light-emitting layer.

4. The organic electroluminescent element according to claim 1, wherein:
each of the red phosphorescent light-emitting layer and the green phosphorescent light-emitting layer contains a hole transport material as a host material;
the red phosphorescent light-emitting layer is disposed closer to the reflecting electrode; than the green phosphorescent light-emitting layer; and
the green phosphorescent light-emitting layer is disposed closer to the transparent electrode than the red phosphorescent light-emitting layer.

5. The organic electroluminescent element according to claim 1, wherein:
the first light-emitting unit is disposed closer to the transparent electrode than the second light-emitting unit; and
the second light-emitting unit is disposed closer to the reflecting electrode than the first light-emitting unit.

6. The organic electroluminescent element according to claim 1, wherein
the film thickness (tR) of the red phosphorescent light-emitting layer and the film thickness (tG) of the green phosphorescent light-emitting layer satisfy the relation of $10 \cdot tR < tG$.

7. The organic electroluminescent element according to claim 1, wherein
the film thickness (tR) of the red phosphorescent light-emitting layer and the film thickness (tG) of the green phosphorescent light-emitting layer satisfy the relation of $80 \cdot tR > tG$.

8. The organic electroluminescent element according to claim 1, wherein
the film thickness (tR) of the red phosphorescent light-emitting layer is at most 3 nm.

9. The organic electroluminescent element according to claim 1, wherein
a film thickness of the second light-emitting unit is at least 20 nm.

10. The organic electroluminescent element according to claim 9, wherein
the film thickness of the second light-emitting unit is at most 80 nm.

11. The organic electroluminescent element according to claim 1, wherein
the first light-emitting unit includes a green fluorescent light-emitting layer containing a green fluorescent light-emitting material.

12. The organic electroluminescent element according to claim 11, wherein:
each of the red phosphorescent light-emitting layer and the green phosphorescent light-emitting layer contains an electron transporting material as a host material;
the red phosphorescent light-emitting layer is disposed closer to the transparent electrode than the green phosphorescent light-emitting layer;
the green phosphorescent light-emitting layer is disposed closer to the reflecting electrode than the red phosphorescent light-emitting layer;
the blue fluorescent light-emitting layer is disposed closer to the transparent electrode than the green fluorescent light-emitting layer; and
the green fluorescent light-emitting layer is disposed closer to the reflecting electrode than the blue fluorescent light-emitting layer.

13. The organic electroluminescent element according to claim 11, wherein:
each of the red phosphorescent light-emitting layer and the green phosphorescent light-emitting layer contains a hole transport material as a host material;
the red phosphorescent light-emitting layer is disposed closer to the reflecting electrode than the green phosphorescent light-emitting layer; and
the green phosphorescent light-emitting layer is disposed closer to the transparent electrode than the red phosphorescent light-emitting layer;
the blue fluorescent light-emitting layer is disposed closer to the transparent electrode than the green fluorescent light-emitting layer; and
the green fluorescent light-emitting layer is disposed closer to the reflecting electrode than the blue fluorescent light-emitting layer.

14. The organic electroluminescent element according to claim 1, wherein
the film thickness (tR) of the red phosphorescent light-emitting layer and the film thickness (tG) of the green phosphorescent light-emitting layer are set such that an emission color is configured to change into an intended color due to a continuous drive of the organic electroluminescent element.

15. A method of manufacturing an organic electroluminescent element, comprising:
forming a transparent electrode;
forming a first light-emitting unit above the transparent electrode, the first light-emitting unit including a blue fluorescent light-emitting layer containing a blue fluorescent light-emitting material;
forming an intermediate layer above the first light-emitting unit;
forming a second light-emitting unit above the intermediate layer, the second light-emitting unit including a red phosphorescent light-emitting layer containing a red phosphorescent light-emitting material and a green phosphorescent light-emitting layer containing a green phosphorescent light-emitting material; and
forming a reflecting electrode above the second light-emitting unit,
wherein:
the first light-emitting unit and the second light-emitting unit are stacked such that the intermediate layer is interposed between the first light-emitting unit and the second light-emitting unit; and
in the forming of the second light-emitting unit, a film thickness (tR) of the red phosphorescent light-emitting layer and a film thickness (tG) of the green phosphorescent light-emitting layer satisfy a relation of $7*tR<tG$.

16. The method of manufacturing the organic electroluminescent element according to claim 15, further comprising:
driving the organic electroluminescent element to shift an emission zone with respect to the second light-emitting unit and change an emission color into an intended color.

* * * * *